(12) United States Patent
Lin et al.

(10) Patent No.: US 8,242,842 B2
(45) Date of Patent: Aug. 14, 2012

(54) INPUT COMMON MODE CIRCUIT

(75) Inventors: Yu-Wei Lin, Chu Bei (TW);
Yung-Chow Peng, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/364,043

(22) Filed: Feb. 1, 2012

(65) Prior Publication Data

US 2012/0126897 A1    May 24, 2012

Related U.S. Application Data

(63) Continuation of application No. 12/917,652, filed on Nov. 2, 2010, now Pat. No. 8,130,036.

(60) Provisional application No. 61/258,427, filed on Nov. 5, 2009, provisional application No. 61/264,655, filed on Nov. 25, 2009.

(51) Int. Cl.
*H03F 3/45* (2006.01)
(52) U.S. Cl. .......................... 330/259; 330/257
(58) Field of Classification Search .................. 330/259, 330/257, 260, 261, 51
See application file for complete search history.

(56) References Cited

U.S. PATENT DOCUMENTS

| | | | |
|---|---|---|---|
| 4,887,048 A | 12/1989 | Krenik et al. | |
| 5,557,239 A * | 9/1996 | Masao | 330/259 |
| 6,580,324 B2 * | 6/2003 | Palaskas et al. | 330/258 |
| 7,012,463 B2 * | 3/2006 | Nairn | 330/9 |
| 7,209,006 B1 | 4/2007 | Mohan | |
| 7,642,852 B2 | 1/2010 | Chandra et al. | |
| 7,750,737 B2 | 7/2010 | Srinivasa et al. | |
| 8,031,000 B2 | 10/2011 | Ishii | |

OTHER PUBLICATIONS

Boser, Bernhard, "Electronics for Micromachined Inertial Sensors", Transducers '97, 1997 International Conference on Solid-State Sensors and Actuators, Chicago, Jun. 16-19, 1997, pp. 1169-1172.
Fang, Deyou, et al., "A 1mW Dual-Chopper Amplifier for a 50-ug/Hz Monolithic CMOS-MEMS Capacitive Accelerometer", 2006 Symposium on VLSI Circuits Digest of Technical Papers.
Harrison, Reid R., "A Low-Power Low-Noise CMOS Amplifier for Neural Recording Applications", IEEE Journal of Solid-State Circuits, vol. 38, No. 6, Jun. 2003, pp. 958-965.

* cited by examiner

*Primary Examiner* — Henry Choe
(74) *Attorney, Agent, or Firm* — Lowe Hauptman Ham & Berner, LLP

(57) ABSTRACT

A circuit provides a first current corresponding to the differential input Inn and Inp, and a second current corresponding to the common mode input Vcm. The circuit then mirrors the differential current and the common mode current to a third current and a fourth current. Based on the difference between the mirrored differential current and the mirrored common mode current, the circuit pulls up or pulls down these currents to balance the corresponding difference between the differential input and the common mode input. In effect, the circuit adjusts the input common mode voltage to a desired level, without providing an opportunity for it to rise to an unwanted level.

20 Claims, 6 Drawing Sheets

INPUT COMMON MODE CIRCUIT

CROSS-REFERENCE TO RELATED APPLICATIONS

The present application is a continuation application of Ser. No. 12/917,652, filed Nov. 2, 2010, which claims priority of U.S. Provisional Patent Application Ser. Nos. 61/258,427, filed Nov. 5, 2009 and 61/264,655, filed on Nov. 25, 2009 which are incorporated herein by reference in their entireties.

TECHNICAL FIELD

The present disclosure is generally related to an input common mode circuit. Depending on applications, the input common mode circuit may be used with a capacitance-voltage converter amplifier or a capacitive amplifier to set appropriate levels as desired.

BACKGROUND

MEMs (Microelectromechanical system) devices usually cannot provide fully differential structures. For example, in an approach, when a MEMs accelerometer is used with a C-V converter (e.g., a capacitor-to-voltage converter) that requires a fully-differential signal, a modulating signal is applied at the single proof mass of the MEMs device and the differential inputs of the C-V converters are coupled to the other two electrodes of the same MEMs device. The large modulating signal, however, generally creates a large common mode signal coupling to the inputs, which cannot be easily suppressed, and, as a result, can cause corruption at the output. To really suppress this large common mode signal, an input common mode feed back is required, which makes the accelerometer more complicated.

Another approach related to MEMs accelerometer type I uses a differential amplifier to feedback a reverse signal and drive a pair of capacitors. To completely suppress the input common mode signal, the same reverse signal and the same capacitor values are required but difficult to fabricate, and create extra loading affecting circuit bandwidth. Further, capacitor mismatch, if it exists, can create a differential signal that may corrupt the MEMs signals. Additionally, extra circuitry may be required to maintain the DC input common mode level.

Another approach related to MEMs accelerometer type II does not provide full-differential signals for inputs, causing the charge injection to offset the signals. To solve the problem a reset signal and complex clock scheme is needed.

A capacitive-amplifier approach using feedback resistors to set input common mode requires very large resistance, commonly implemented by MOS transistors. The resistor, however, cannot sustain the common voltage due to device leakage when the resistance is large.

BRIEF DESCRIPTION OF THE DRAWINGS

The details of one or more embodiments of the disclosure are set forth in the accompanying drawings and the description below. Other features and advantages of the disclosure will be apparent from the description, drawings, and claims.

Like reference symbols in the various drawings indicate like elements.

DETAILED DESCRIPTION

Figure 1:
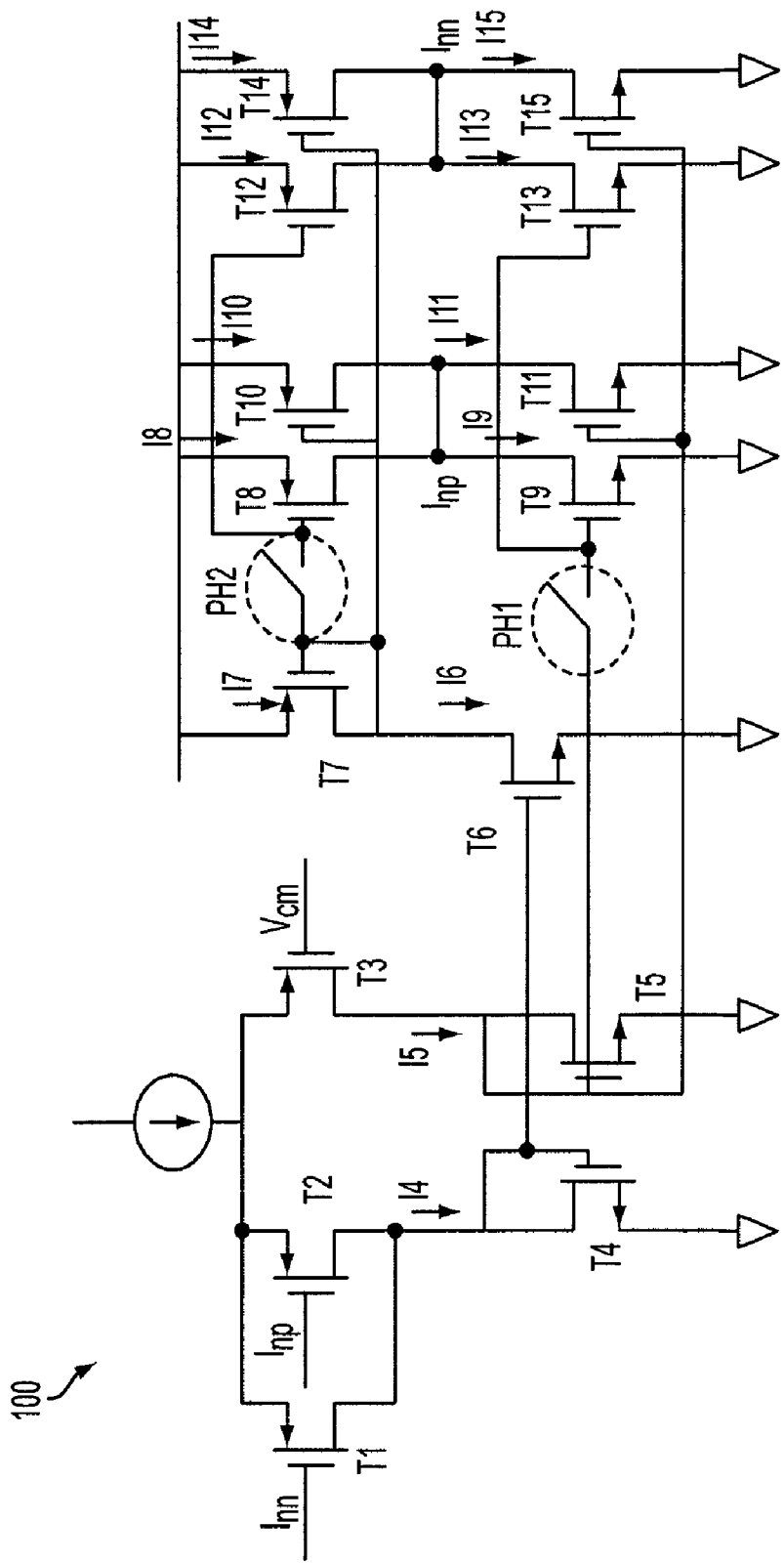
FIG. 1 shows an input common mode circuit, in accordance with an embodiment.

Embodiments, or examples, of the disclosure illustrated in the drawings are described below using specific language. It will nevertheless be understood that no limitation of the scope of invention is thereby intended. Any alterations and modifications in the described embodiments, and any further applications of principles of the disclosure described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number.

Input Common Mode Circuit

FIG. 1 shows an input common mode circuit 100 in accordance with an embodiment for adjusting signals Inn and Inp. Signals Inn and Inp are differential signals, and may be used as inputs to various other amplifier circuits attached to circuit 100 (e.g., capacitance-voltage converter amplifiers, capacitive amplifiers, etc.). Signal Vcm is the common mode input signal and may be used as a reference for the common mode signal, e.g., voltage Vanp, of signals Inn and Inp of the amplifier using circuit 100. Generally, in an ideal situation voltage Vcm or voltage Vanp is equal to the average of voltage Inn and Inp.

Circuit 100 may be considered an amplifier with input and output stages in which transistors T1, T2, T3, T4 and T5 constitute an input stage and transistors T8, T9, T10, T11, T12, T13, T14, and T15 constitute an output stage. Transistors T6 and T7 mirror currents from the input stage to be adjusted and fed back to the inputs by the output stage. FIG. 1 showing the drain of transistors T8 and T10 (also the drain of transistors T9 and T11) as voltage Inp indicates various embodiments of the disclosure provide a feedback loop from this node to the gate of transistor T2, which is also shown with voltage Inp. Similarly, the drain of transistors T12 and T14 (also the drain of transistors T13 and T15) shown as voltage Inn are fed back to voltage Inn at the gate of transistor T1. Various embodiments of the disclosure in effect form a closed feedback loop to set the common mode input Vanp of voltages Inn and Inp as specified by voltage Vcm. Alternatively expressed, various embodiments charge/discharge the levels of voltages Inn and Inp, set the DC point of voltages Inn and Inp, and suppress voltage variations based on the coupling and directions of these variations.

Transistors T1, T2, and T3 serve as the input transistors. Transistors T4 and T5 perform the amplification mirroring function. Current I4 corresponds to differential input Inn and Inp while current I5 corresponds to common mode input Vcm. Transistor T4 is configured as a current mirror mirroring current I4 to current I6 of transistor T6.

Transistor T5 is also configured as a current mirror to mirror current I5 to currents I9 and I13 of transistors T9 and T13 when switch PH1 is closed.

When there is a difference between voltage Vanp and voltage Vcm, there is a difference in AC current reflecting on currents I4 and I5, and transistors T4 and T5 acting as an amplifier detects and amplifies this current difference.

Transistor T7, also acting as a current mirror, mirrors current I7 to current I8 and I12 of transistors T8 and T12 when switch PH2 is closed.

Switch PH1 controls the pair of transistors T9 and T13. When switch PH1 is closed, transistor T5 with corresponding current I5 turns on transistors T9 and T13. When switch PH1 is open, it turns off the pair of transistors T9 and T13 as the gate of these transistors are open. Switch PH2 controls transistors T8 and T12. When switch PH2 is closed, transistor T7 with corresponding current I7 turns on transistors T8 and T12, and when switch PH2 is open, it turns off transistors T8 and T12 as the gate of these transistors are open. Depending on applications, voltages Inn and Inp are part of or may be referred to as the differential signals of an input signal (e.g., signal In, FIG. 3), and various embodiments of the disclosure generate a first clock (e.g., clock PH1_CLK) to control (e.g., close/open) switch PH1 at the rising edge of input voltage In and a second clock (e.g., clock PH2_CLK) to control switch PH2 at the falling edge of input voltage In. Because voltage In serves as a clock, and voltages Inp and Inn are alternatively charged and discharged based on this clock, various embodiments of the disclosure may be referred to as dynamically charging and discharging.

Transistors T8, T9, T12, and T13 may be referred to as the first part of the output stage of circuit 100. Transistors T8, T9, T12, and T13 are configured to charge/discharge (pull-up/pull-down) appropriate currents and thus voltage levels of voltages Inn and Inp. Transistors T8 and T12 are controlled by switch PH2 so that they are on during the active pulse width of clock PH2_CLK (FIG. 2) that is generated following a modulating input, and are off otherwise. Similarly, transistors T9 and T13 are controlled by switch PH1 so that they are on during the active pulse width of clock PH1_CLK (FIG. 2) that is generated following a modulating input, and are off otherwise. In various embodiments, when transistors T8 and T12 are on transistors T9 and T13 are off, and when transistors T8 and T12 are off, transistors T9 and T13 are on. Further, transistors T9 and T13, when switch PH1 are closed, discharge currents I9 and I13 or pull down the level of voltages Inn and Inp, and transistors T8 and T12, when switch PH2 are closed, charge up currents I8 and I12 or pull up the level of voltages Inn and Inp.

Transistors T10, T11, T14, and T15 are compatible (e.g., similar) to transistors T8, T9, T12, and T13 and may be referred to as the active output stage of circuit 100. When circuit 100 is in operation, transistors T10, T14, T11 and T15 are configured to be always on to provide the static current to sustain the DC level for inputs Inn and Inp or this level may float and/or drift to a level caused by current leakage. The pair of transistors T11 and T15 are activated (e.g., on) based on current I5 mirrored from transistor T5 while the pair of transistors T10 and T14 are activated based on currents I7 and I6 mirrored from current I4 by transistor T4. In various embodiments, the transistors in the same pair (e.g., transistors T8 and T12, T10 and T14, T9 and T13, T11 and T15) are of the same size. Further, because transistors T8 and T12 are to provide current to reduce/eliminate the common mode input variations while transistors T10 and T14 are to maintain the DC common mode level, in various embodiments, transistors T10 and T14 are configured to be much smaller than transistors T8 and T12. Similarly, transistors T11 and T15 are much smaller than transistors T9 and T13. The size of transistors T8, T12, T9, and T13 is selected based on the estimated variations of the common mode input to be suppressed.

In various embodiments, transistors T1, T2, T4 are configured to provide current I4 corresponding to voltages Inn and Inp, and transistors T3 and T5 are configured to provide current I5 corresponding to voltage Vcm. Transistors T4 and T5 are then configured to mirror currents I4 and I5 to currents I6 and I9, respectively. Transistors T6, T7, T8, T9, T10 and T11 are configured to adjust currents I8 and I9, and I10 and I11. In effect, voltage Inp is adjusted via the drain of transistors T8 and T10 or the drain of transistors T9 and T11. Similarly, transistors T12, T13, T14, and T15 are configured to adjust currents I12 and I13, and I14 and I15, or in effect, voltage Inn is adjusted via the drain of transistors T12 and T14 or the drain of transistors T13 and T15. By appropriately adjusting voltages Inn and Inp, voltage Vanp is adjusted. As a result, voltage Vanp is enabled to be equal to voltage Vcm, and thus the common mode input of voltages Inn and Inp is restored to the specified level of voltage Vcm. Alternatively expressed, variations of the common mode input of voltages Inn and Inp are suppressed and this common mode input is restored to the normal or desired level. FIG. 1 shows one set of transistors T8, T12, T9, and T13 illustrating an embodiment, but to help adjusting the currents and corresponding voltages faster, additional sets of transistors compatible to the set of transistors T8, T12, T9, and T13 can be added. In various embodiments, if there is not any input signal (e.g., input to the C-V converter), transistors T8, T12, T9, and T13 are turned off (e.g., inactive). When a modulating input is applied, however, the clock pulses controlling switches PH1 and PH2 are generated, which turns on the corresponding transistors T8 and T12 or T9 and T13 to speed up restoring the input common mode voltage. Generally, transistors T10, T12, T11, and T13 have been on to sustain the DC common mode level.

In the examples described below, initially there was no input signal, then a modulating signal is applied at the inputs, and, depending on applications, transistors T8 and T12 or T9 and T13 are turned on accordingly. Those of ordinary skill in the art will recognize that circuit 100, when in the steady state, I7=I6, I8=I9, I10=I11, I12=I13, and I14=I15. As a result, if Vanp≠Vcm, then I4≠I5, or I9≠I6 or I9≠I7 or I8≠I7. Transistor T7, however, acting as a current mirror, mirrors current I7 to current I8 or forces I7=I8 in view of I6=I7 and I8=I9. Alternatively expressed, when I7≠I8, transistor T8 causes voltages Inn and Inp to be adjusted such that Vanp=Vcm, or I4=I5, or I9=I6, or I9=I7 or I8=I7. That is, if Vanp<Vcm, then, in various embodiments, voltages Inn and Inp are raised or voltage Vanp is raised so that Vanp=Vcm, and if Vanp>Vcm, then voltages Inn and Inp are lowered or voltage Vanp is lowered so that Vanp=Vcm.

For example, if Vanp<Vcm, then I5<I4, or I11<I6, or I11<I7, or I11<I10, in various embodiments, transistors T8 and T12 are turned on (e.g., by closing switches PH2) such that transistor T10 together with transistor T8 provides current and pulls up voltage Inp, and transistor T14 together with transistor T12 provides current and pulls up voltage Inn. Because voltages Inn and Inp increase (e.g., are pulled up), voltage Vanp increases until Vanp=Vcm. If, however, Vanp>Vcm, then I5>I4, or I11>I6, or I11>I7 or I11>I10 then transistors T9 and T13 are turned on (e.g., by closing switch PH1) such that transistor T11 together with transistor T9 provides current and pulls down voltage Inp, and transistor T15 together with transistor T13 provides current and pulls down voltage Inn. Because both voltages Inn and Inp decrease (e.g., are pulled down), voltage Vanp decreases until Vanp=Vcm.

Various embodiments of the disclosure use dynamic large currents I8 and I12 to charge, and large currents I9 and I13 to discharge the inputs and thus recover the possible large common mode coupling to keep the circuit in normal operation. The term "large" is used to indicate that currents I8 and I12 in various embodiments are much larger than currents I10 and I14. Similarly, currents I9 and I13 are much larger than currents I11 and I15.

Waveforms Illustrating Clock Formation

Figure 2:
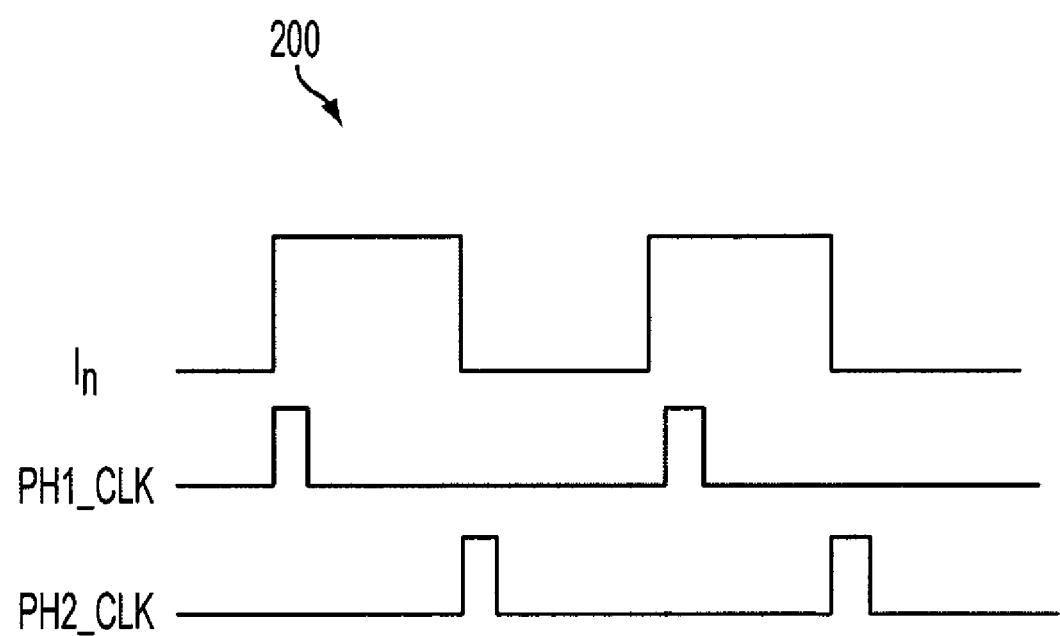
FIG. 2 shows waveforms illustrating how clocks controlling the switches PH1 and PH2 in FIG. 1 are formed, in accordance with an embodiment.

FIG. 2 shows waveforms 200 illustrating formation of clocks PH1_CLK and PH2_CLK to control (e.g., close/open) switches PH1 and PH2, respectively.

Generally, the switching (e.g., transitioning from a low to a high or from a high to a low) of signal In affects the level of the input common mode. In an embodiment, when signal In transitions from a low to a high, voltages Inn and Inp and thus the input common mode tend to rise, in various embodiments, PH1_CLK is generated to pull down/discharge this rising input. In contrast, when signal In transitions from a high to a low, voltages Inn and Inp and thus the input common mode tend to be lowered, clock PH2_CLK is generated to pull up this lowered voltage.

Further, in various embodiments, switch PH1 is closed during clock PH1_CLK is pulsed and switch PH2 is closed during clock PH2_CLK is pulsed. In various embodiments, the pulse widths of clocks PH1_CLK and PH2_CLK are programmed to control the time/duration for switch PH1 and PH2 to be closed/open as appropriate. For example, in various embodiments, a programmable delay circuit is used to expand/shorten these pulse widths. As a result, the time for switches PH1 and PH2 and thus the charging/discharging time is adjusted accordingly. Generally, a large common mode input variation to be suppressed corresponds to a larger pulse width while a smaller common mode variation to be suppressed corresponds to a smaller pulse width. Based on the amount of time desired to suppress the unwanted input common mode, the corresponding pulse widths are programmed.

When there is no data input (e.g., no signal In in FIG. 3), in various embodiments, clocks PH1_CLK and PH2_CLK are configured to be off so that transistors T8, T12, T9, and T13 are off. This is because in a steady state, in various embodiments, only a small amount of current is kept in transistors T10, T14, T11, and T15 to sustain the DC level for voltages Inn and Inp, without turning on transistors T8, T12, T9, and T13. In effect, transistors T8, T12, T9, and T13 are turned on dynamically to respond to the AC input variations and suppress them accordingly. As a result, static current in various embodiments is low, saving power.

Because in various embodiments the reset cycle is not used to maintain the input common mode like switch capacitor circuits, capacitive amplifiers is enabled to process continuous time signals and thus avoid noise commonly found in those circuits (e.g., noise resulted from the switch operation that induces charge injection of the switch-capacitor circuits). As a result, various embodiments are beneficial for low-noise designs.

Capacitance-Voltage Converter, First Application

In various embodiments that use circuit 100, the input common mode of various amplifiers (e.g., capacitive amplifiers, capacitance-voltage converter amplifiers, etc.) can be set.

Figure 3:
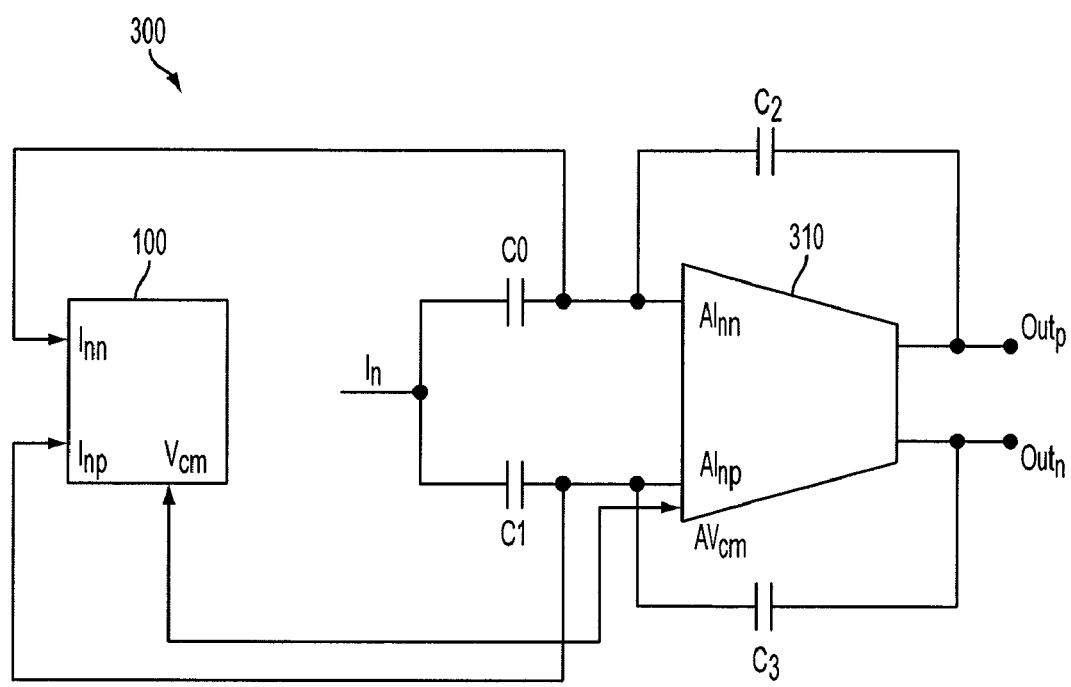
FIG. 3 shows a circuit utilizing the input common mode circuit in FIG. 1 in a capacitance-voltage converter amplifier, in accordance with an embodiment.

FIG. 3 shows a circuit 300 that utilizes the input common mode circuit 100 in a capacitance-voltage converter amplifier, in accordance with an embodiment. Amplifier 310 may be referred to as a capacitance-to-voltage converter amplifier, which amplifies and converts the capacitance difference to voltage difference. Amplifier 310 is fully differential. The gain (e.g., amplifying factor) at output Outp is based on the ratio C0/C2 while the gain at output Outn is based on the ratio C1/C3. Inputs Inn and Inp of circuit 100 are connected to inputs AInn and AInp of amplifier 310 while the common mode input Vcm of circuit 100 is connected to the common mode input AVcm of the same amplifier 310. Outputs Outp and Outn of amplifier 310 or of circuit 300 are fed back to voltage Inn and Inp. Using the internal feedback of circuit 100 the average of voltages Inn and Inp (or of voltages AInn and AInp) equals to the common mode voltage Vcm (or voltage AVcm). In various embodiments, voltages Inn and Inp are adjusted to achieve the level of voltage Vcm, which may be set as desired.

Generally, voltage In acts as a clock and, via capacitors C0 and C1, when transitioning from a low to a high, couples voltages Inn and Inp to a higher voltage. In various embodiments, switch PH1 is closed to turn on transistors T9 and T13 to discharge voltage Inn and Inp to restore the common mode voltage Vcm. Similarly, voltage In, when transitioning from a high to a low, couples voltages Inn and Inp to a lower voltage. In various embodiments, switch PH2 is closed to turn on transistors T8 and T12 to charge voltage Inn and Inp to restore the common mode voltage Vcm. In effect, in various embodiments, the large common mode voltage variation, if it exists, is suppressed and performance of circuit 300 is improved.

As illustrated in FIG. 3, input common mode circuit 100 is configured to set the common mode voltage (e.g., the DC level) of amplifier 310 to a desired level. Circuit 100 also includes circuitry (e.g., transistors T8, T12, T9, and T13) to help restore voltage Vcm quickly. In the static state, transistors T8, T12, T9, and T13 are off, saving power consumption for the circuit as a whole.

Figure 4:
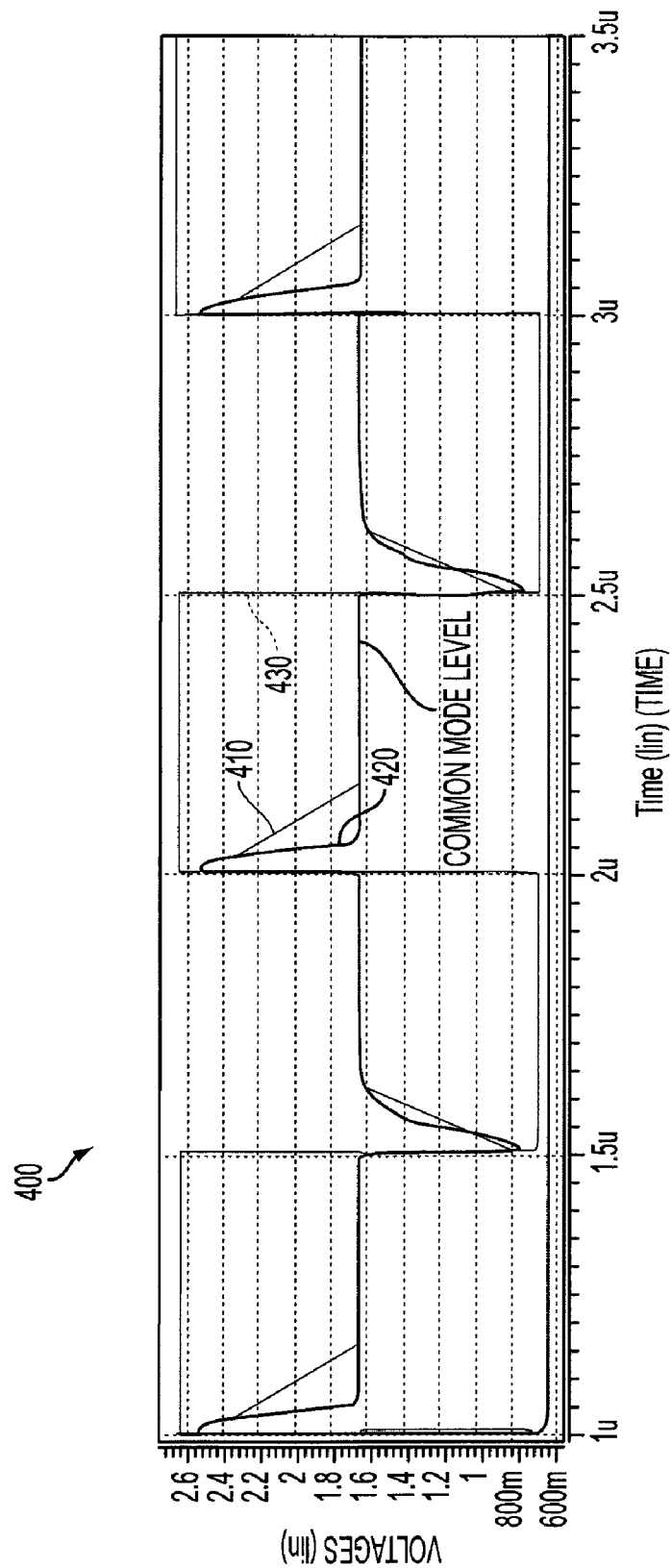
FIG. 4 shows waveforms illustrating performance of the circuit in FIG. 3, in accordance with an embodiment.

FIG. 4 shows waveforms 400 illustrating performance of circuit 300. Signal 410 represents the input common mode of amplifier 310 without using the charging/discharging capabilities of input common mode circuit 100. Signal 420 represents the input common mode of amplifier 310 using input common mode circuit 100 utilizing the dynamic charging/discharging capabilities, in accordance with the embodiment in FIG. 3. Signal 430 represents signal In. As shown in FIG. 4, after signal In has transitioned from a low to a high, both signals 410 and 420 are transitioning from a high to the common mode level. Signal 420, however, advantageously transitions to and reaches this common mode level faster than signal 410. In an embodiment, signal 420 takes about 0.1 µS while signal 410 takes about 0.3 µS to reach the common mode level. Similarly, after signal In has transitioned from a high to a low, signal 420 also advantageously transitions to and reaches the common mode level faster than signal 410 does.

Capacitive Amplifier, $2^{ND}$ Application

Figure 5:
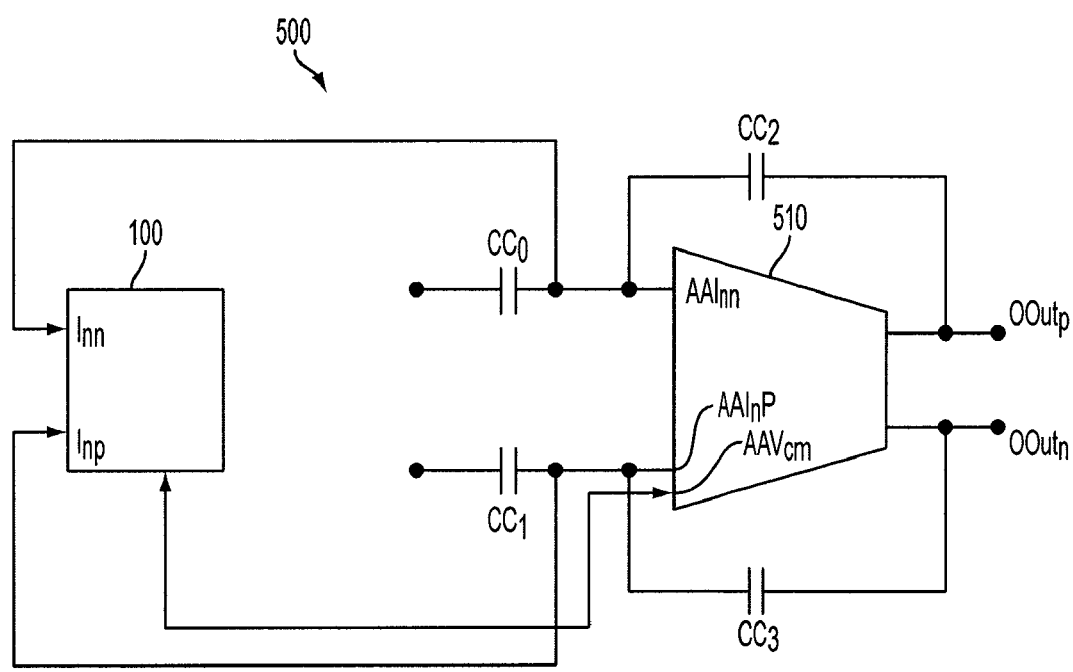
FIG. 5 shows a circuit utilizing the input common mode circuit in FIG. 1 in a capacitive amplifier, in accordance with an embodiment.

FIG. 5 shows a circuit 500 illustrating circuit 100 being used with a capacitive amplifier 510, in accordance with an embodiment. Amplifier 510 includes input capacitors CC0 and CC1, and feedback capacitors CC2 and CC3 as shown. Similarly to circuit 400, inputs Inn, Inp, Vcm of circuit 100 are coupled to corresponding inputs AAInn, AAInp, and AAVcm of the capacitive amplifier 510. Generally, capacitive amplifier 510 is without a DC path to set the input common mode. In various embodiments that use circuit 100, mechanisms are provided to provide a solid DC input common mode voltage to amplifier 510.

Figure 6:
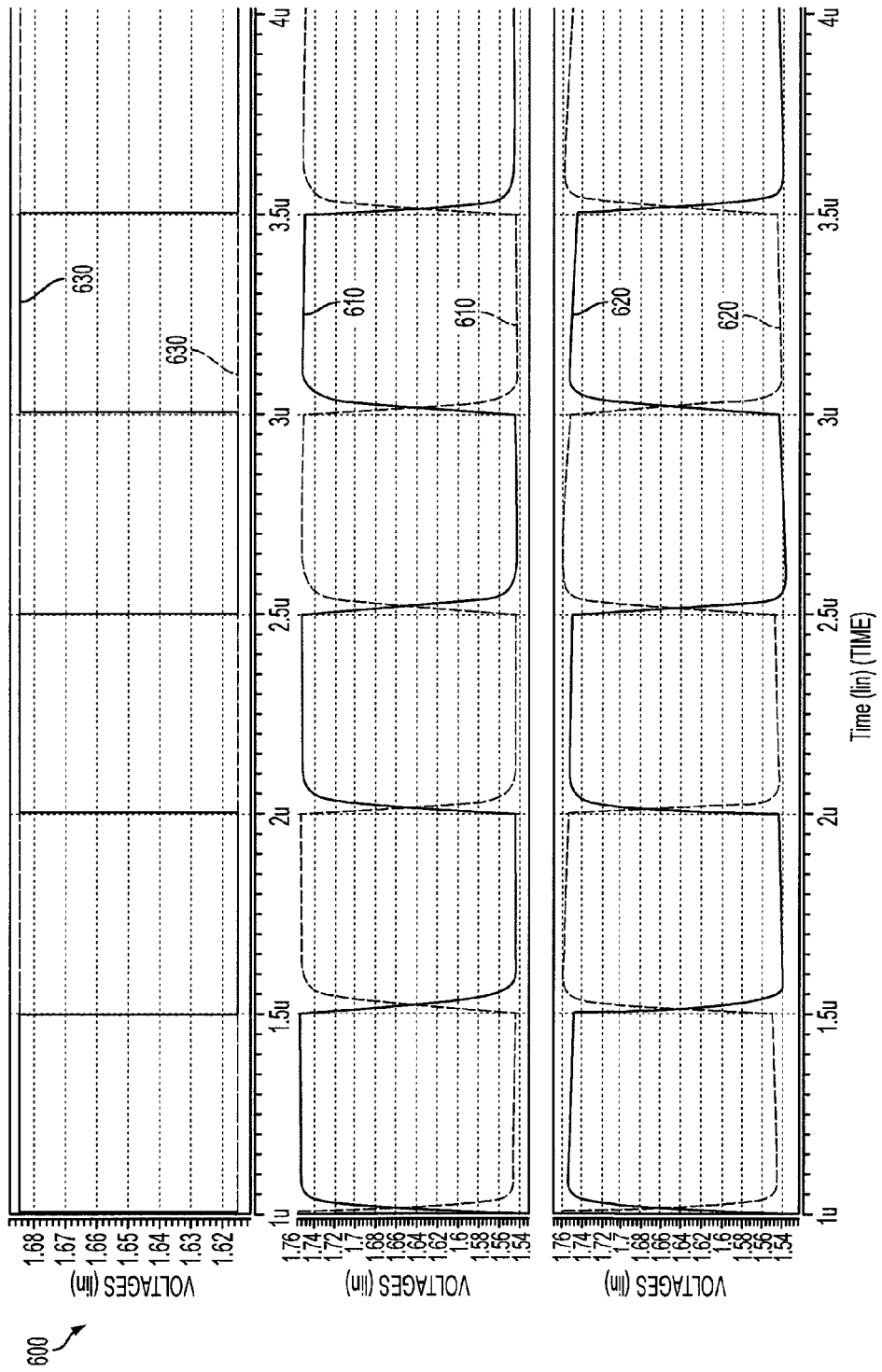
FIG. 6 shows waveforms illustrating performance of the circuit in FIG. 5, in accordance with an embodiment.

FIG. 6 shows waveforms 600 illustrating performance of circuit 500. Signal 610 represents the output of circuit 500 without using input common mode circuit 100, but using a 50 MΩ feedback resistor to set the input common mode. Signal 620 represents the output of circuit 500 that utilizes the DC input maintenance feature (e.g. by transistors T10 and T14, and T11 and T15) of input common mode circuit 100, in accordance with the embodiment in FIG. 5. In this illustration, transistors T8, T9, T12, and T13 are off to turn off the charging/discharging capabilities. Signal 630 represents input signal In. As shown, signal 610 shows significant distortion as both the low and the high logic levels of signal 610 have slopes. In contrast, signal 620 shows improvements with insignificant distortion, i.e., the logic levels of signal 620 are substantially horizontal.

A number of embodiments have been described. It will nevertheless be understood that various modifications may be made without departing from the spirit and scope of invention. For example, FIGS. 3 and 5 show two illustrative circuits 300 and 500 that can benefit from various embodiments and may be used in capacitive sensing circuits, e.g., to detect capacitance changes from MEMs accelerometer, gyroscope, microphone, etc., but the disclosure is not so limited. Various embodiments may be used in various other types of capacitive amplifiers in various other types of applications. Various embodiments are not limited to a particular level when a signal is activated or deactivated, but, rather, selecting such a level is a matter of design choice and is within the scope of invention. The various transistors being shown as a particular type (e.g., NMOS, PMOS, etc.) are also for illustration, various embodiments are not limited to a particular type, but the particular type selected for a transistor is also a design choice and within the scope of various embodiments. Various mechanisms (e.g., a transistor) may be used as switches PH1 and PH2 and various embodiments are not limited to any mechanism.

What is claimed is:

1. A circuit comprising:
a first transistor having a gate terminal and a drain terminal, the gate terminal of the first transistor being configured to receive a first voltage;
a second transistor having a gate terminal and a drain terminal, the gate terminal of the second transistor being configured to receive a second voltage, and the drain terminal of the first transistor being connected with the drain terminal of the second transistor;
a third transistor having a gate terminal and a drain terminal, the gate terminal of the third transistor being configured to receive a reference voltage;
a fourth transistor having a gate terminal and a drain terminal, the gate terminal of the fourth transistor being connected with the drain terminal of the fourth transistor and the drain terminals of the first and second transistors;
a fifth transistor having a gate terminal and a drain terminal, the gate terminal of the fifth transistor being connected with the drain terminal of the fifth transistor and the drain terminal of the third transistor;
a sixth transistor having a gate terminal and a drain terminal, the gate terminal of the sixth transistor being connected with the gate terminal of the fourth transistor;
a seventh transistor having a gate terminal and a drain terminal, the gate terminal of the seventh transistor being connected with the drain terminal of the seventh transistor and the drain terminal of the sixth transistor;
an eighth transistor having a gate terminal and a drain terminal, the gate terminal of the eighth transistor being coupled with the gate terminal of the seventh transistor, and the drain terminal of the eighth transistor being coupled with the gate terminal of the first transistor;
a ninth transistor having a gate terminal and a drain terminal, the gate terminal of the ninth transistor being coupled with the gate terminal of the fifth transistor, and the drain terminal of the ninth transistor being coupled with the gate terminal of the first transistor;
a tenth transistor having a gate terminal and a drain terminal, the gate terminal of the tenth transistor being coupled with the gate terminal of the eighth transistor, and the drain terminal of the tenth transistor being coupled with the gate terminal of the second transistor; and
an eleventh transistor having a gate terminal and a drain terminal, the gate terminal of the eleventh transistor being coupled with the gate terminal of the ninth transistor, and the drain terminal of the eleventh transistor being coupled with the gate terminal of the second transistor.

2. The circuit of claim 1, further comprising:
a first switch coupled between the gate terminal of the eighth transistor and the gate terminal of the seventh transistor; and
a second switch coupled between the gate terminal of the ninth transistor and the gate terminal of the fifth transistor.

3. The circuit of claim 2, wherein:
the gate terminal of the tenth transistor is connected with the gate terminal of the eighth transistor; and
the gate terminal of the eleventh transistor is connected with the gate terminal of the ninth transistor.

4. The circuit of claim 1, further comprising:
a first switch coupled between the gate terminal of the tenth transistor and the gate terminal of the seventh transistor; and
a second switch coupled between the gate terminal of the eleventh transistor and the gate terminal of the fifth transistor.

5. The circuit of claim 1, wherein:
the gate terminal of the eighth transistor is connected with the gate terminal of the seventh transistor; and
the gate terminal of the ninth transistor is connected with the gate terminal of the fifth transistor.

6. The circuit of claim 5, wherein:
the gate terminal of the tenth transistor is connected with the gate terminal of the seventh transistor; and
the gate terminal of the eleventh transistor is connected with the gate terminal of the fifth transistor.

7. The circuit of claim 6, further comprising:
a twelfth transistor having a gate terminal and a drain terminal, the gate terminal of the twelfth transistor being coupled with the gate terminal of the seventh transistor, and the drain terminal of the twelfth transistor being coupled with the gate terminal of the first transistor;
a thirteenth transistor having a gate terminal and a drain terminal, the gate terminal of the thirteenth transistor being coupled with the gate terminal of the fifth transistor, and the drain terminal of the thirteenth transistor being coupled with the gate terminal of the first transistor;
a fourteenth transistor having a gate terminal and a drain terminal, the gate terminal of the fourteenth transistor being connected with the gate terminal of the twelfth transistor, and the drain terminal of the fourteenth transistor being coupled with the gate terminal of the second transistor;

an fifteenth transistor having a gate terminal and a drain terminal, the gate terminal of the fifteenth transistor being connected with the gate terminal of the thirteenth transistor, and the drain terminal of the fifteenth transistor being coupled with the gate terminal of the second transistor;

a first switch coupled between the gate terminal of the twelfth transistor and the gate terminal of the seventh transistor; and a second switch coupled between the gate terminal of the thirteenth transistor and the gate terminal of the fifth transistor.

8. The circuit of claim 1, wherein:
the gate terminal of the tenth transistor is connected with the gate terminal of the seventh transistor; and
the gate terminal of the eleventh transistor is connected with the gate terminal of the fifth transistor.

9. The circuit of claim 1, wherein the first, second, third, seventh, eighth, and tenth transistors are P-type transistors, and the fourth, fifth, sixth, ninth, and eleventh transistors are N-type transistors.

10. The circuit of claim 9, further comprising a first power node and a second power node, wherein source terminals of the first, second, third, seventh, eighth, and tenth transistors are coupled to the first power node, and source terminals of the fourth, fifth, sixth, ninth, and eleventh transistors are coupled to the second power node.

11. The circuit of claim 1, further comprising:
a first capacitor coupled with the gate terminal of the first transistor;
a second capacitor coupled with the gate terminal of the second transistor;
an amplifier having a positive input terminal, a negative input terminal, a positive output terminal, and a negative output terminal, the positive input terminal coupled with the gate terminal of the first transistor, and the negative input terminal coupled with the gate terminal of the second transistor;
a third capacitor coupled between the positive input terminal and the negative output terminal; and
a fourth capacitor coupled between the negative input terminal and the positive output terminal.

12. The circuit of claim 11, further comprising an input node, wherein the first capacitor is coupled between the input node and the gate terminal of the first transistor, and the second capacitor is coupled between the input node and the gate terminal of the second transistor.

13. A circuit comprising:
a first input node;
a second input node;
means for converting a common mode voltage at the first input node and the second input node to a first current;
means for converting a reference voltage to a second current;
means for adjusting a direct current voltage level at the first input node and a direct current voltage level at the second input node according to comparison of the first current and the second current.

14. The circuit of claim 13, further comprising:
means for selectively increasing a capability to increase the direct current voltage level at the first input node; and
means for selectively increasing a capability to increase the direct current voltage level at the second input node.

15. The circuit of claim 13, further comprising:
means for selectively increasing a capability to decrease the direct current voltage level at the first input node; and
means for selectively increasing a capability to decrease the direct current voltage level at the second input node.

16. The circuit of claim 13, wherein the means for adjusting the direct current voltage level at the first input node and the direct current voltage level at the second input node comprising:
a first transistor and a second transistor coupled with the first transistor at the first input node;
a third transistor and a fourth transistor coupled with the third transistor at the second input node; and
means for generating:
a first gate voltage for the first and the third transistors based on the first current; and
a second gate voltage for the second and the fourth transistors based on the second current.

17. A method comprising:
generating a first current according to an input common mode voltage at a first input node and a second input node;
generating a second current according to a reference voltage;
generating a first gate voltage according to the first current;
generating a second gate voltage according to the second current;
adjusting a direct current voltage level at the first input node by driving a first transistor and a second transistor coupled to the first input node, the driving of the first transistor including biasing a gate terminal of the first transistor at the first gate voltage, and the driving of the second transistor including biasing a gate terminal of the second transistor at the second gate voltage; and
adjusting a direct current voltage level at the second input node by driving a third transistor and a fourth transistor coupled to the second input node, the driving of the third transistor including biasing a gate terminal of the third transistor at the first gate voltage, and the driving of the fourth transistor including biasing a gate terminal of the fourth transistor at the second gate voltage.

18. The method of claim 17, further comprising selectively biasing gate terminals of a fifth transistor and a sixth transistor at the first gate voltage, wherein the fifth transistor is coupled to the first input node, and the sixth transistor is coupled to the second input node.

19. The method of claim 18, wherein the selectively biasing is performed according to an input clock signal.

20. The method of claim 17, further comprising selectively biasing gate terminals of a fifth transistor and a sixth transistor at the second gate voltage, wherein the fifth transistor is coupled to the first input node, and the sixth transistor is coupled to the second input node.

* * * * *